United States Patent
Barcley

(10) Patent No.: US 6,678,159 B1
(45) Date of Patent: Jan. 13, 2004

(54) METHOD OF TRANSPORTING HEAT FROM A HEAT DISSIPATING ELECTRICAL ASSEMBLAGE

(75) Inventor: Tina P. Barcley, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/328,051

(22) Filed: Dec. 23, 2002

(51) Int. Cl.[7] .................................................. H05R 7/20
(52) U.S. Cl. ....................... 361/704; 361/707; 361/719; 361/721; 174/16.1; 174/16.3; 165/80.2; 165/185; 211/41.17
(58) Field of Search ................................ 361/688–690, 361/695, 704, 716, 720, 721, 725, 727, 729, 741; 174/16.1, 16.3; 165/80.2, 80.3, 185; 211/41.17

(56) References Cited

U.S. PATENT DOCUMENTS

| | | |
|---|---|---|
| 4,215,361 A | 7/1980 | McCarthy |
| 4,235,283 A | 11/1980 | Gupta |
| 4,563,725 A | 1/1986 | Kirby |
| 4,785,379 A * | 11/1988 | Goodrich .................... 361/711 |
| 4,899,255 A | 2/1990 | Case |
| 4,909,752 A * | 3/1990 | Hallum et al. .............. 439/325 |
| 5,270,902 A | 12/1993 | Bellar et al. |
| 5,818,696 A * | 10/1998 | Knoop ........................ 361/730 |
| 5,859,764 A * | 1/1999 | Davis et al. ................. 361/704 |
| 5,887,435 A * | 3/1999 | Morton .......................... 62/3.6 |
| 5,949,650 A * | 9/1999 | Bulante et al. ............. 361/704 |
| 6,212,075 B1 * | 4/2001 | Habing et al. ............. 361/719 |

* cited by examiner

Primary Examiner—Boris Chérvinsky
(74) Attorney, Agent, or Firm—Clyde E. Bailey, Sr.

(57) ABSTRACT

A method of transporting heat from a heat dissipating electrical assemblage having a circuit board insertable in a card cage or retaining unit and at least one heat generating component mounted thereon. A heat sink is arranged in contact with the electrical assemblage and forms a coplanar wall spaced apart from the interior wall of the card cage. A thermal transport element is arranged in the thermal gap formed between the coplanar wall and the interior wall. The thermal transport element is at least in partial contact with the coplanar wall and interior wall thereby transporting heat from the hotter electrical assemblage to the cooler interior wall of the card cage.

8 Claims, 3 Drawing Sheets

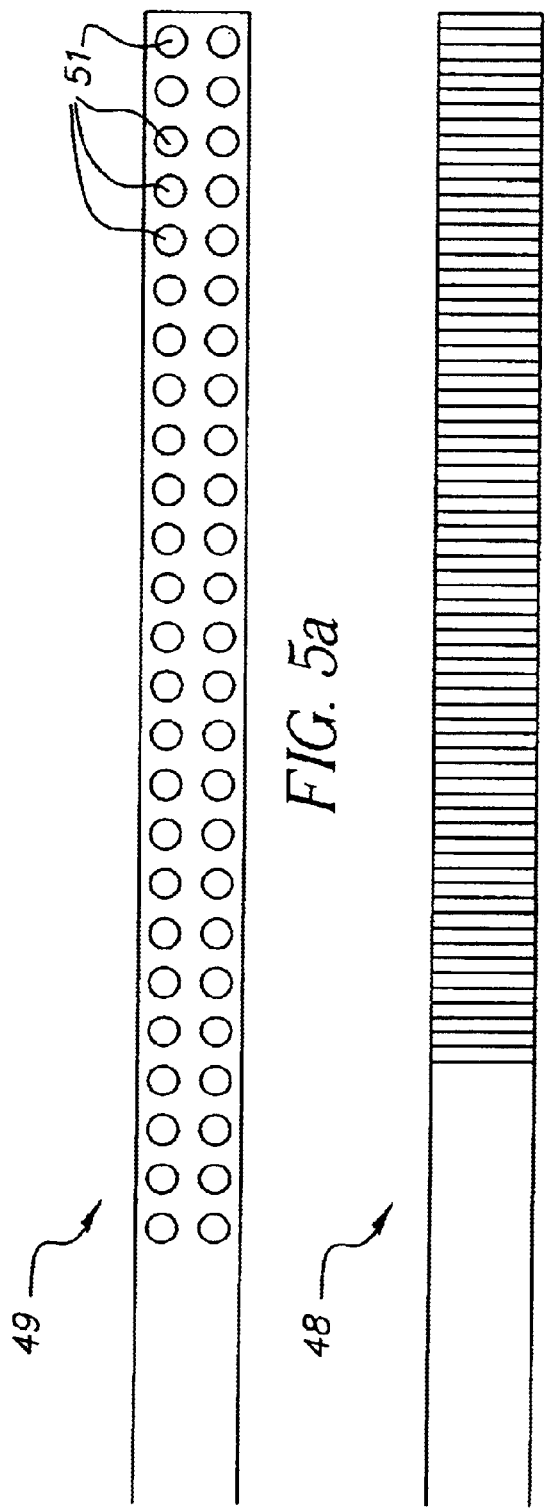
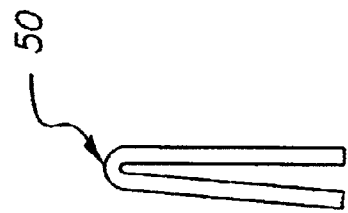

METHOD OF TRANSPORTING HEAT FROM A HEAT DISSIPATING ELECTRICAL ASSEMBLAGE

CROSS-REFERENCE TO RELATED APPLICATIONS

The present application is related to U.S. application Ser. No. 10/327,826, filed Dec. 23, 2002, by Tina P. Barcley, and titled, "Thermal Transport Element For Use With A Heat Dissipating Electrical Assemblage."

FIELD OF THE INVENTION

The invention relates generally to the field of broad electronic technology (BET), and in particular to thermal management for wedge-lock mounting into card cages. More specifically, the invention relates to a method for improving the cooling path from the heat sink on the circuit board to the card cage chassis.

BACKGROUND OF THE INVENTION

It is well known in the field of electronic technology that overheating electronic assemblages containing heat generating components, such as processors, transistors, diodes etc., contributes to reducing the life of the component or module as well as the overall reliability while in service. As electrical assemblages or products containing such components become denser and contain components that have higher wattages per square area, component overheating becomes a larger problem as well as a limiting factor in the reliability of the electrical assemblage. Thus, eliminating or substantially reducing the heat from such components during service must be accomplished before product reliability can be greatly improved. The performance and reliability of commercial electronic products are limited by the inability of the products to dissipate heat generated by densely packed electrical components. Moreover, a related problem in the electronic art involves circuit boards configured in a card cage. It is known that limited progress has been made in the art for removing heat from such electrical assemblages.

Prior art attempts to address the aforementioned problems have met with limited success. Some artisans have taken advantage of the heat sink positioned on one side of the circuit card/board and the thermal path between the heat sink to the slot of the card cage. Since this is a relatively small area, it is generally deemed to offer limited opportunities for making this an effective and cost effective heat transfer location. Moreover, it is well known that heat dissipation through the wedge lock securing the circuit board has been improved over the last 10 years with changes in the construction and materials of the wedge-lock. However, it is also well known that there remains a considerable challenge in making this an effective means of improving the heat transfer from the electrical assemblage. Hence, most of the heat does not transfer through the wedge-lock, but through the back side of the board or the heat sink. To improve layout area, the heat sink has become more open with cutouts. This technique is known to reduce the stiffness of the assembly, which reduces the resonant frequency. To increase the frequency, ribs (both horizontal and vertical) are often added to the heat sink. With a rib of the heat sink aligned with a wall of the wedge-lock, increased thermal path area is now available at the "edge" of the assembly. The associated problem is the air gap between the circuit card/board and the bottom of the receiving slot.

Other prior art attempts to address the aforementioned problem has resulted in varying degrees of success. In the area of commercial electronics, such as computer electronics, the most common solution is to utilize costly component constructions. In the automotive electronic area, costly circuit board materials are generally used to reduce component overheating.

Therefore, there persists a need in the art for an electronic assemblage that operates at considerably cooler junction and board temperatures. Further, there is a need for a cost effective method of reducing the heat generated by hot components in electronic assemblages under high and ordinary service loads.

SUMMARY OF THE INVENTION

The present invention is directed to overcoming one or more of the problems set forth above. Briefly summarized, according to one aspect of the present invention, a method is disclosed for transporting heat from an electrical assemblage. A retaining unit (card cage) securely retains the electrical assemblage and wedge lock. A heat sink is arranged in fluid communication with both the electrical assemblage and the wedge lock such that a rear wall of the wedge lock and a side wall of the heat sink form a coplanar thermal wall. The coplanar thermal wall is spaced apart from an interior wall of said retaining unit to form a thermal gap therebetween. A heat transfer element is disposed in the thermal gap such that at least a portion of the heat transfer element contacts at least a portion of the coplanar thermal wall and the interior wall of the retaining unit for transporting dissipated heat therebetween.

The present invention has numerous advantages over prior art developments. More particularly, the electronic assemblage of the invention operates at lower temperatures and is, therefore, more reliable. Further, the electronic assemblage can allocate space in proximity to the heat-generating element for specific electrical traces essential for the design layout. Furthermore, the electronic assemblage of the invention may contain a larger number of standard and thinner width size components.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 5a is a top plane view of a half sheared hole spring type thermal transport element of the invention;

FIG. 5b is a top plane view of the corrugated spring type thermal transport element of the invention; and FIG. 6 is an elevated side view of a biased clip spring type thermal transport element of the invention.

DETAILED DESCRIPTION OF THE INVENTION

Figure 1:
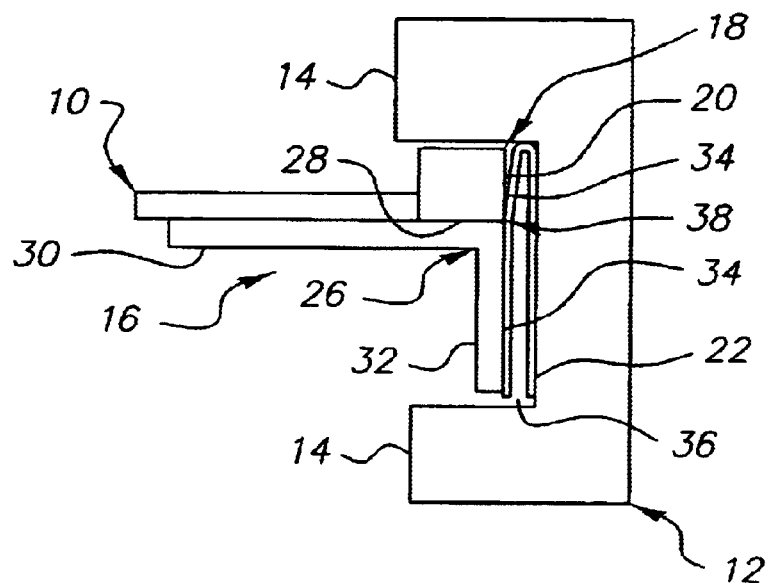
FIG. 1 is an elevated plane view of the heat transporting electrical assemblage of the invention.
Figure 2:
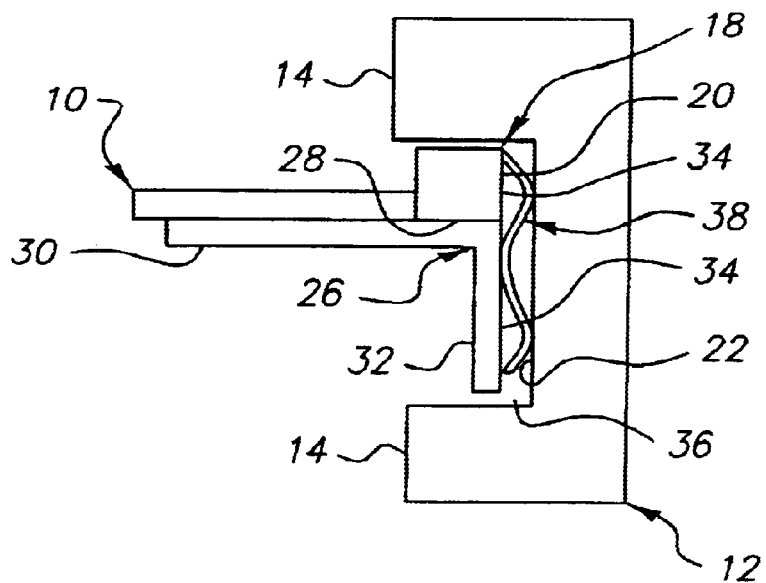
FIG. 2 is an elevated plane view of another alternative embodiment of the invention.

Turning now to the drawings, and in particular to FIGS. 1 and 2, the electrical assemblage (circuit board 10 only shown) of the invention is illustrated retained in a retaining unit, such as a card cage 12. A typical electrical assemblage of the invention includes a circuit board 10 and at least one heat dissipating component, such as, a processor, transistor, diode, etc. (not shown) mounted thereon. Card cage 12 has a frame 14, preferably substantially C-shaped, which forms a receiving slot 16 for housing supporting circuit board 10 and heat dissipating components mounted thereon (not shown). A wedge lock 18 is mounted in the frame 14 for securing the circuit board 10 in the substantially C-shaped frame 14. Wedge lock 18 has a rear wall 20 positioned proximate to an interior wall 22 of the receiving slot 16.

The wedge lock 18 is generally secured to heat sink 26 (described below) by use of fasteners. The wedge lock 18, alternatively, may be secured to the slot wall. In either mounting configuration, the wedge lock 18, when engaged, uses pressure caused by the sliding sections (not shown) of the wedge lock 18 to effectively wedge and lock the electrical assemblage 10 into the slot. The pressure is maintained across the width of the slot thereby maintaining a gap between the electrical assemblage/wedge lock to the rear wall of the receiving slot 16.

Figure 3:
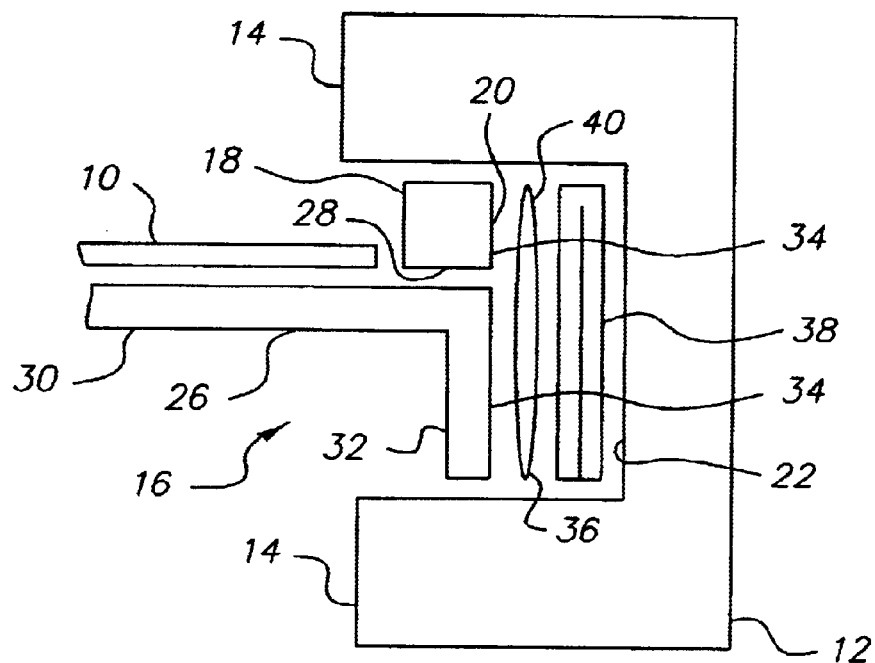
FIG. 3 is an elevated plane view of still another alternative embodiment of the invention.
Figure 4:
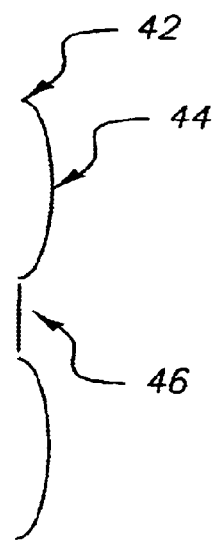
FIG. 4 is a plane view of a substantially flat spring type thermal transport element of the invention.

According to FIGS. 1–3, a heat sink 26 is arranged in fluid communications with the circuit board 10 (representing the electrical assemblage) and with a bottom wall 28 of the wedge lock 18. While heat sink 26 can have practically any configuration, in the preferred embodiment, heat sink 26 has first wall 30 substantially normal to a second side wall 32. Further, side wall 32 of heat sink 26 is aligned with the rear wall 20 of wedge lock 18 so as to form a substantially coplanar thermal wall 34 with the rear wall 20 of the wedge lock 18. A thermal gap 36 is formed between the substantially coplanar thermal wall 34 and the interior wall 22 of the receiving slot 16. Important to the invention, a heat transport element 38 is inserted in the thermal gap 36. Importantly, thermal gap 36 provides for tolerance and maintenance of the receiving slot 16. At least a portion of the heat transport element 38 is in contact with each of the wedge lock 18 and heat sink 26 and the interior wall 22 of the card cage 12 for transporting dissipated heat therebetween. According to FIG. 3, alternatively, an interface layer 40, such as any one of available synthetic and silicone thermal greases, may be arranged in the thermal gap 36 contacting the heat transport element 38 and the coplanar thermal wall 34. Interface layer 40 enables increased heat transport from the electrical assemblage 10 during operations. In any event, the thermal gap 36 still needs to be maintained for tolerances and assembly purposes. Skilled artisans will appreciate that an adhesive cannot be used in the thermal gap 36 due to maintenance requirements, particularly the need to remove the card cage 12.

Referring to FIGS. 4, 5a, 5b, and 6, heat transport element 38 may take practically any form but is preferably a flexible thermal heat conducting material. Preferred forms of flexible thermal heat conducting materials include a substantially flat spring 42 (FIG. 4) having a first width 44 and a second width 46, a half-sheared hole spring 49 (FIG. 5a), a corrugated shaped spring 48 (FIG. 5b) and a biased clip spring 50 (FIG. 6). Skilled artisans will appreciate that there are several varieties of flat spring 42. Any design that provides a biased force in the thermal gap 36 against the interior wall 22 of frame 14 and the coplanar planar thermal wall 34 would be preferable. Currently, a material with a large portion of copper or beryllium would provide the spring type quality with the thermal properties that are desirable. According to FIG. 4, in one embodiment, the substantially flat spring 42 may have a first width 44 larger than the second width 46. Alternatively, substantially flat spring 42 may have a first width 44 smaller than the second width 46 (not shown). According to FIGS. 5a and 5b, the half-sheared hole spring 49, the preferred corrugated spring 48, respectively, each has a thickness of about 0.007 inches to about 0.010 inches. The half-sheared hole spring 49 has half-sheared holes 51. These may be organized in any pattern or spacing. Maximizing the area of contact of the interior wall 22 and the coplanar thermal wall 34 will provide the best design. Moreover, the flexible thermal heat conducting material may be one selected from the group consisting of beryllium copper, beryllium, copper, stainless steel, and brass, with beryllium copper being the most preferred. Further, the flexible thermal heat conducting material may even be a thermoplastic or elastomeric plastic material. While the card cage 12 may be made from any thermally conductive material, aluminum is the preferred material. Other materials from which card cage 12 may be constructed include zinc, brass, copper, and aluminum beryllium metals.

The preferred construction for thermal transport element 38 includes a beryllium copper formed spring. Since the spring is formed, a ductile metal was used in this construction. The beryllium copper could be replaced by beryllium, copper, stainless steel, brass, etc. for a similar formed construction. If the flexible thermal heat conducting material were molded, it would be possible to use a thermal plastic or elastomeric type material. With the "rib" at the edge of the heat sink, a much-increased area is now available for contact to the thermal transport element 38. It would be possible to use the spring with a standard flatplate heat sink, but it would be less effective due to the thermal contact area. In the simple thermal model that was made, a block was inserted for the spring with a 50% contact factor. A temperature reduction of 5° F. was realized during experimentation. If more contact area or a higher percentage of contact area could be achieved, a larger temperature difference could be realized. More contact area can be achieved by optimizing the shape of the thermal transport element 38 to ensure maximum contacts, adding an interface material 40 (described above) in the thermal gap 36, adding structure to the frame 14 of the card cage 12. Another way to make the thermal transport element 38 more effective would be to conduct more heat to that edge of the circuit board 10. A heat sink 26 with more conduction paths to the edge would make the thermal transport element 38 more effective and hence reduce the temperature an even larger amount. This design uses an aluminum card slot—if brass, copper, aluminum beryllium metal, etc. were used, then the thermal transport element 38 would also be more effective.

In another aspect of the invention, a method of transporting heat from an electrical assemblage (circuit board 10 only shown) retained in a retaining unit is herein disclosed. The retaining unit, or card cage 12, has a wedge lock 18 for securing the electrical assemblage 10 in the retaining unit. A heat sink 26 is arranged in fluid communications with both the electrical assemblage 10 and the wedge lock 18 such that a rear wall of the wedge lock 18 and a side wall of the heat sink 26 form a coplanar thermal wall 34. Coplanar thermal wall 34 is spaced apart from an interior wall 22 of the retaining unit or card cage 12, to form a thermal gap 36 therebetween. A thermal transport element 38 is disposed in the thermal gap 36 such that at least a portion of the thermal transport element 38 contacts at least a portion of the coplanar thermal wall 34 and the interior wall 22 of receiving slot 16 for transporting dissipated heat therebetween.

The invention has been described with reference to a preferred embodiment. However, it will be appreciated that variations and modifications can be effected by a person of ordinary skill in the art without departing from the scope of the invention.

Parts List 10 electrical assemblage represented by circuit board
12 card cage
14 frame
16 receiving slot
18 wedgelock
20 rear wall
22 interior Wall
26 heat sink
28 bottom Wall
30 first wall
32 second side wall
34 coplanar thermal wall
36 thermal gap
38 heat transfer element
40 interface layer
42 flat spring
44 first width of spring 42
46 second width of spring 42
48 corrugated spring
49 half-sheared hole spring
50 biased clip spring
51 half-sheared hole

What is claimed is:

1. A method of heat transporting heat from an electrical assemblage retained in a retaining unit, said retaining unit having a wedge lock securing said electrical assemblage in said retaining unit, said method comprising the steps of:

arranging a heat sink in fluid communications with both said electrical assemblage and said wedge lock such that a rear wall of said wedge lock and a side wall of said heat sink form a coplanar thermal wall spaced apart from an interior wall of said retaining unit to form a thermal gap therebetween; and disposing a heat transfer element in said thermal gap such that at least a portion of said heat transfer element contacts at least a portion of said coplanar thermal wall and said interior wall of said retaining unit for transporting dissipated heat therebetween.

2. The method recited in claim 1 wherein said step of disposing a heat transfer element includes the step of providing a heat transfer element comprising a flexible heat conducting material.

3. The method recited in claim 2 wherein the step of providing a heat transfer element includes the step of providing a corrugated shaped spring.

4. The method recited in claim 3 wherein the step of providing a corrugated shaped spring includes the step of providing a corrugated spring having a thickness in the range of 0.007 inches to about 0.010 inches.

5. The method recited in claim 2 wherein the step of providing a heat transfer element includes the step of providing a half sheared hole shaped spring.

6. The method recited in claim 2 wherein the step of providing a heat transfer element includes the step of providing a biased clip spring.

7. The method recited in claim 2 wherein the step of providing a heat transfer element includes the step of providing a substantially flat spring having a first width and a second width, said first width being larger than said second width.

8. The method recited in claim 2 wherein the step of providing a heat transfer element includes the step of providing a substantially flat spring having a first width and a second width, said first width being smaller than said second width.

* * * * *